United States Patent [19]

Nagata et al.

[11] Patent Number: 5,005,959
[45] Date of Patent: Apr. 9, 1991

[54] ILLUMINATION SYSTEM

[75] Inventors: Shinichi Nagata, Kyoto; Atsushi Kikkawa, Osaka; Kenji Endo, Nagaokakyo, all of Japan

[73] Assignee: Dainippon Screen Mfg. Co., Ltd., Japan

[21] Appl. No.: 357,642

[22] Filed: May 24, 1989

Related U.S. Application Data

[63] Continuation of Ser. No. 062,440, Jun. 12, 1987, abandoned.

[30] Foreign Application Priority Data

Jun. 13, 1986 [JP] Japan ................. 61-138479

[51] Int. Cl.$^5$ ............... G02B 3/08; F21V 13/00
[52] U.S. Cl. ................. 350/452; 350/409; 362/268
[58] Field of Search ............ 350/452, 235, 236, 237, 350/415, 409; 362/268, 311, 326, 335

[56] References Cited

U.S. PATENT DOCUMENTS

| | | |
|---|---|---|
| 801,766 | 10/1905 | Churchill ............. 350/452 |
| 1,393,573 | 10/1921 | Ritter ................ 350/452 |
| 1,986,065 | 1/1935 | Maillet ............... 350/452 |
| 2,003,804 | 7/1932 | Falge ................. 350/452 |
| 3,064,125 | 11/1962 | Gott .................. 350/452 |
| 3,619,023 | 11/1971 | Brooks ................ 350/3.7 |
| 3,761,184 | 9/1973 | McLaughlin, Jr. ...... 350/452 |
| 4,023,888 | 5/1977 | Klaenhammer et al. ... 350/452 |
| 4,321,594 | 3/1982 | Galvin et al. ........ 350/452 |
| 4,389,115 | 6/1983 | Richter ............... 355/26 |
| 4,530,587 | 7/1985 | Kosugi et al. ......... 355/53 |

FOREIGN PATENT DOCUMENTS

| | | |
|---|---|---|
| 0086410 | 8/1983 | European Pat. Off. . |
| 0239007 | 9/1987 | European Pat. Off. ......... 350/452 |
| 2803277 | 8/1979 | Fed. Rep. of Germany . |
| 2939204 | 4/1980 | Fed. Rep. of Germany . |
| 3441298 | 5/1985 | Fed. Rep. of Germany . |

OTHER PUBLICATIONS

Zhdanov and Pankova, "Plastic Fresnel Lenses for Projector Condenser Systems", Optical Technology, vol. 38, No. 2, 2/71, pp. 106–109.
Halliday and Resnick, *Fundamentals of Physics*, 1981, pp. 710–713.

*Primary Examiner*—Bruce Y. Arnold
*Assistant Examiner*—David R. Parsons
*Attorney, Agent, or Firm*—Ostrolenk, Faber, Gerb & Soffen

[57] ABSTRACT

An illumination system applicable to contact or proximity exposure apparatuses provides excellently collimated light without any irradiance reduction in the peripheral area of an object to be illuminated and includes a light source, an ellipsoidal mirror positioned with respect to the light source, an optical system designed so that the entrance height of the light received in the entrance pupil thereof is substantially proportioned to the tangent of the exit angle in the exit pupil thereof, and a single Fresnel lens designed so that light passing therethrough is abated in the spherical aberration. Light exiting from the optical system is received on the front surface of the Fresnel lens, where the irradiance distribution is uniform through the surface, and the Fresnel lens transmits light received with abated spherical aberration to a mask film bearing a desired circuit pattern.

4 Claims, 13 Drawing Sheets

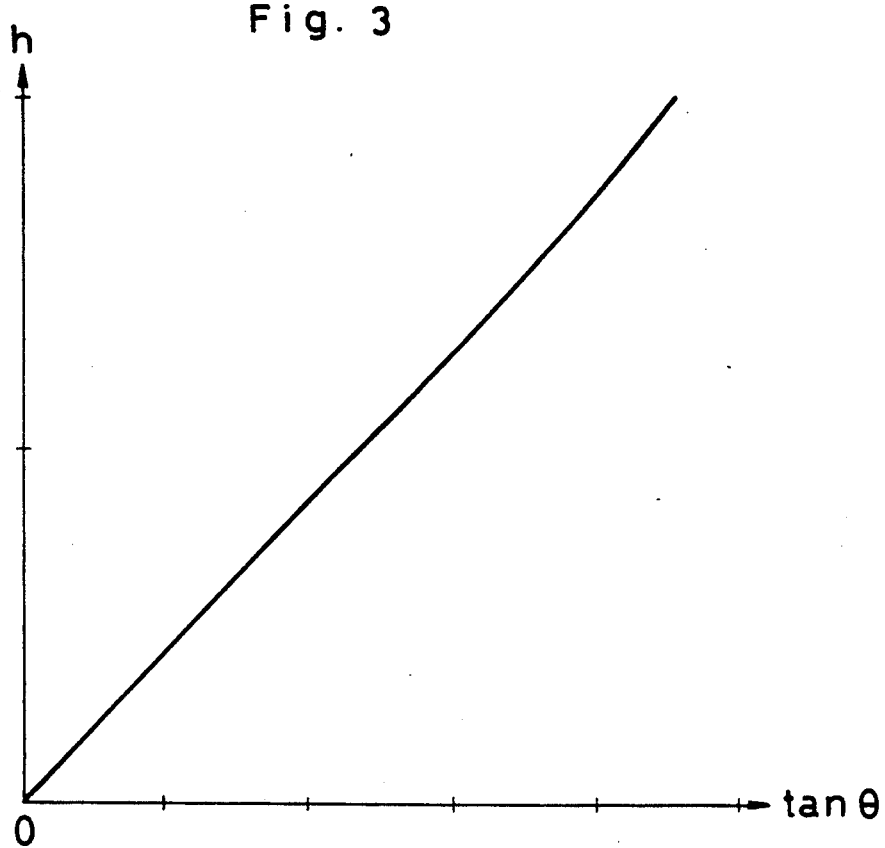
Fig. 3
Fig. 5
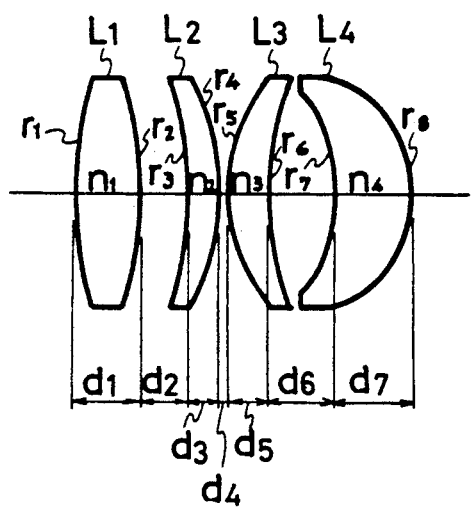
Fig. 4
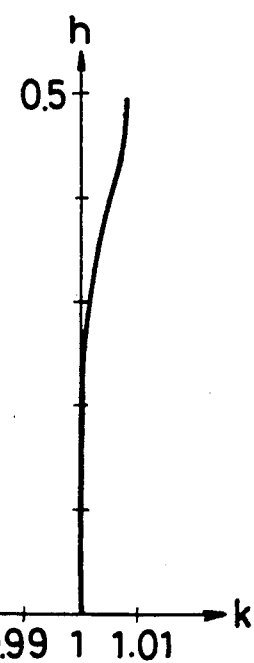

ILLUMINATION SYSTEM

This is a Continuation of Application Ser. No. 07/062,440 filed on June 12, 1987.

BACKGROUND OF THE INVENTION

The present invention relates generally to a novel illumination system, and particularly to an illumination system which provides excellently well-collimated light for exposure, without any irradiance reduction in the peripheral area of an object to be illuminated, so that it is particularly useful for an exposure system applicable to exposure of printed circuit boards, integrated circuits or the like, for an exposure system applicable to contact exposure apparatus for plate making, step-and-repeat machines or the like, and for an illumination system applicable to copy machines or the like.

It is well known that several illumination systems have been used in an exposure apparatus for use in contact exposure and proximity exposure for printed circuit boards. One of these illumination systems is shown in U.S. Pat. No. 4,389,115 patented to Richter, which is indeed advantageous for the purpose of improving the uniformity of light intensity on an object to be illuminated, in comparison with conventional illumination systems theretofore. However, Richter patent requires an elaborately curved collimation mirror, which is positioned as remotely as possible from a secondary light source.

Generally, in order to correct the non-uniformity of the luminous intensity distribution of a light source, a secondary light source is formed by an appropriate optical system, light from which is converted into collimated light by a collimation system. In such optical system, it is needed to make the intensity distribution of the incident light to the collimation system uniform. For this reason, the illumination system disclosed in Richter patent is arranged so that the collimation mirror is positioned as remotely as possible from the secondary light source. Furthermore, the Richter patent teaches that one should adopt an elaborately curved collimation mirror having a long focal length, for the purpose in abating the spherical aberration.

For these reasons, conventional illumination systems heretofore have a long optical path, which makes an illumination apparatus incorporating such illumination systems large in size.

SUMMARY OF THE INVENTION

Accordingly, it is a principal object of the present invention to provide a novel illumination system particularly useful for illumination on an object to be illuminated with a well-collimated light.

It is another object of the invention to provide an illumination system which applies an illumination of exellently well-collimated light to the object without any irradiance reduction in the peripheral area thereof.

It is a further object of the invention to provide an illumination system which realizes a short optical path of the system.

The aforementioned objects are accomplished by the present invention, with an illumination system which includes a light source; a reflector positioned with respect to said light source to direct light emitted from said light source along an optical path; an optical system for forming a secondary light source on the optical axis thereof, said optical system comprising an entrance pupil for receiving light from the light source, an exit pupil for passing the light received and an optical axis which extends to the light source and the object respectively, through the optical system, wherein the entrance height of the light received in the entrance pupil is substantially proportioned to the tangent of the exit angle in the exit pupil; and collimation means disposed between said exit pupil and the object to be illuminated for applying well-collimated light to the object. The secondary light source is formed, by the optical system, at the focal point of the collimation means. The optical system mentioned above is one that satisfies the formula:

$$\tan \theta \propto h \tag{1}$$

where $\theta$ is an exit angle of the optical system, and $h$ is an entrance height in the entrance pupil.

Then, the formula (1) can be expressed by the following formula:

$$\frac{h}{\tan \theta} = k \tag{2}$$

where $k$ is a proportional constant.

Accordingly, the optical system is designed so that the formula (2) is substantially established therein, whereby the irradiance on the entrance surface of the collimation means is uniform through the entire area. In this case, the proportional constant $k$ is not limited.

The collimation means is preferably designed into a Fresnel lens having a short focal distance without any spherical aberration, which applies an exellently well-collimated light to an object to be illuminated without any irradiance reduction in the peripheral area thereof and with abating the spherical aberration.

The configuration of the Fresnel lens is designed so as to satisfy formulae:

$$\theta = \tan^{-1}\left(\frac{H}{f'}\right)$$

$$\theta' = \sin^{-1}\left(\frac{\sin \theta}{n}\right)$$

$$\tan \alpha = \frac{n \cos \theta' - 1}{n \sin \theta'}$$

$$R = H + d \tan \theta'$$

where $f'$ is a distance on the optical axis between the secondary light source and the incident surface of the Fresnel lens; $H$ is a distance between the optical axis and a point upon which light emitted from the secondary light source is impinged; $\theta$ is an incident angle at such point; $n$ is a refractive index of the medium of the Fresnel lens; $\theta'$ is an angle that light entered into the Fresnel lens forms, hence one that light exited therefrom forms, relative to the optical axis; $\alpha$ is an angle which the groove surface forms relative to the optical axis; $R$ is a distance between the optical axis and a point that light exited from the Fresnel lens; and $d$ is a thickness of the Fresnel lens.

Having the aforementioned features, the present invention has the following useful advantages:

The irradiance reduction in the peripheral area of the object to be illuminated, which will be caused in accordance with the cosine fourth law, can be resolved to realize a uniform irradiance distribution on the entrance surface of the collimation means, i.e. Fresnel lens. Then, the Fresnel lens applies well-collimated light with uniform irradiance distribution onto the object.

The length of the optical path between the light source and the object, particularly one between the secondary light source and the Fresnel lens, can be extensively and effectively reduced, since the angular aperture is wide in the optical system according to the invention, whereas the wide range on the Fresnel lens can be evenly and uniformly illuminated thereby. Thus, the collimated light from the Fresnel lens is applied to the illumination of the object having the wide range to be illuminated.

Light entered into the optical system can be effectively used for illumination of the object, without any loss of light.

The illumination system is particularly useful for use in an exposure apparatus of compact in size.

The spherical aberration of the Fresnel lens can easily be abated by easy processing of the surface thereof.

Other novel features and advantages of the invention will become apparent in the course of the following detailed description taken together with the accompanying drawings, which are directed only to the understanding of the present invention and not to the restriction of the scope of the invention.

BRIEF DESCRIPTION OF THE DRAWINGS

FIG. 3 is a graphic representation which shows the relationship between the entrance height and the tangent of an exit angle of an optical system;

FIG. 4 is an elevational view of the first example of the optical system;

FIG. 5 is a graphic representation which shows the h-k characteristics of the first example;

DETAILED DESCRIPTION OF THE PREFERRED EMBODIMENTS

Figure 1:
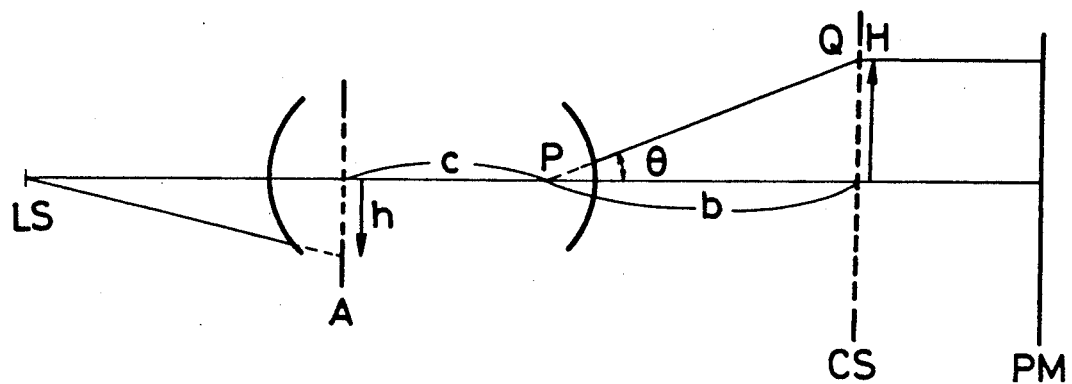
FIG. 1 is a schematic view of the optical system to be incorporated into the illumination system according to the present invention.
Figure 2:
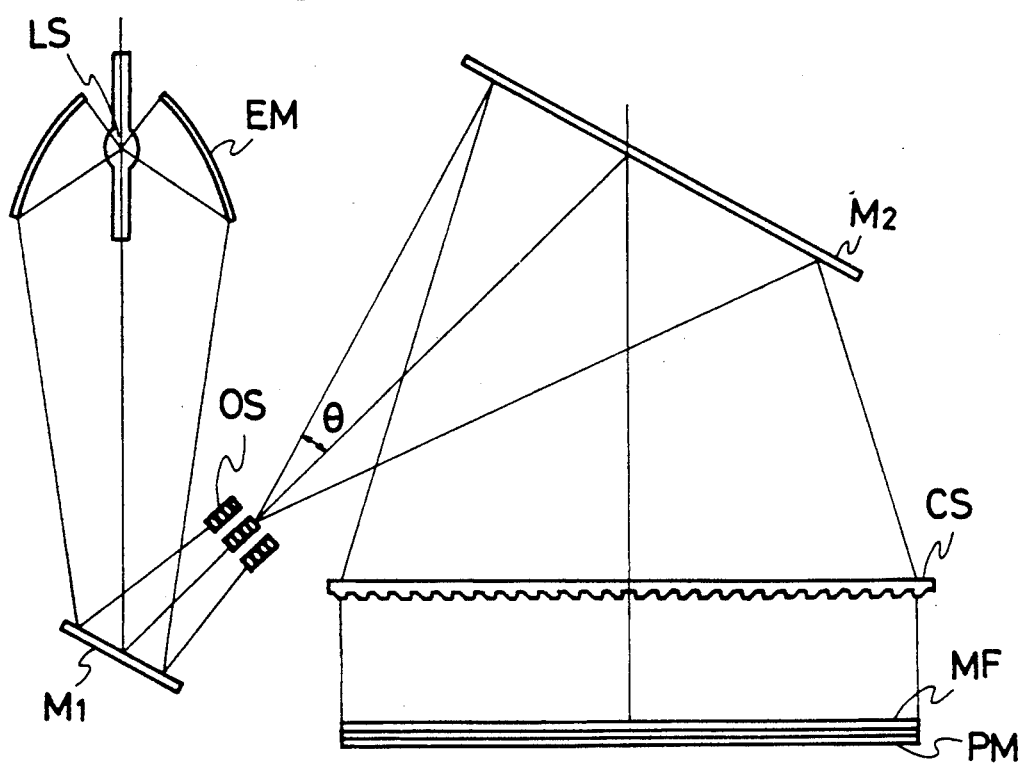
FIG. 2 is a schematic view of the illumination system according to the invention.

Referring to FIGS. 1 and 2, the illumination system according to the invention generally comprises a light source LS, an ellipsoidal mirror EM disposed with respect to the light source LS, a mirror $M_1$ disposed along the light path, an optical system OS, a reflection mirror $M_2$, a collimation system CS, a mask film MF bearing desired circuit patterns thereon and a photosensitive material PM, in order.

The light source LS is positioned at or adjacent to the first focal point of the ellipsoidal mirror EM, so that light emitted from the light source LS is condensed and directed to the optical system OS through the mirror $M_1$. The mirror $M_1$ comprises so-called a cold mirror which allows most of infrared radiation to pass therethrough and reflects most of ultraviolet radiation, thereby various disadvantageous phenomena incurred by heat can be avoided. The optical system OS is positioned at a point adjacent to the second focal point of the ellipsoidal mirror EM, which is preferred in order to form the secondary light source by the optical system OS, since light emitted from the light source LS is most condensed at this point. However, it is sufficient if the optical system OS is disposed at a position optically nearer to the light source LS than that as mentioned above, as long as the light directed toward the optical system OS is received within the effective area thereof.

Light condensed by the ellipsoidal mirror EM enters the optical system OS at the entrance height h (FIG. 1), and in turn exits therefrom at the exit angle $\theta$, to impinge upon the incident surface of the collimation system CS.

The optical system OS is designed so that the entrance height h is substantially proportioned to the tangent of the exit angle $\theta$, which is expressed by the formula (2), which can be transformed as follows:

$$h = k \tan \theta \tag{3}$$

Whereas, it will be apparent from FIG. 1 that the following formula is established:

$$\tan \theta = (H/b) \tag{4}$$

where H is an illumination height between the optical axis and the point on which the light entered at the entrance height h is impinged upon a point Q on the incident surface of the collimation system CS, and b is the distance between the incident surface of the collimation system CS and the point P at which the image of the light source LS, i.e. a secondary light source, is formed.

Accordingly, the following formula is obtained form the formulae (3) and (4):

$$h = (k/b) \cdot H \quad (5)$$

Indeed the exit angle $\theta$ and the illumination height H are changed when the entrance height h is increased or decreased, however the distance b can be regarded as constant because the point P is changed to the extent caused by aberrations, which is so small as be disregarded.

Thus, in the optical system a substantially proportional relationship between the entrance height h and the tangent of the exit angle $\theta$ is established as shown in FIG. 3.

Accordingly, the optical axis will be apparent that the relationship between the radius $A_o$ around the optical axis, of the entrance pupil A, and the radius $S_o$ around it on the incident surface of the collimation system CS (within which the illumination is realized by the light entered through the radius $A_o$) is similarly proportional to the relationship between the entrance height h and the illumination height H. That is, when the value of the radius $A_o$ is increased, the value of the radius $S_o$ is increased at the same rate. From this, it will be apparent that the irradiance distribution on the incident surface of the collimation system CS is the same as that of the entrance pupil A, from the center to the peripheral area thereof.

FIRST EXAMPLE

Referring to FIG. 4, which shows a first example of the optical system OS, four optical units $L_1$ to $L_4$ including four lenses define the optical system OS. Respective lens data of the optical system is listed in Table 1.

TABLE 1

|   | r      | d     | n     |
|---|--------|-------|-------|
| 1 | 1.651  | 0.287 | 1.671 |
| 2 | −1.984 | 0.229 |       |
| 3 | −2.694 | 0.172 | 1.671 |
| 4 | −1.261 | 0.029 |       |
| 5 | 0.803  | 0.229 | 1.671 |
| 6 | 1.680  | 0.287 |       |
| 7 | −0.917 | 0.401 | 1.684 |
| 8 | −0.585 |       |       | f = 1.0,
Effective Aperture = 1.0,
Maximum View Angle = 30 degrees

Referring to FIG. 5, there are shown the characteristics of the proportional constant k relative to the entrance height h when using the optical system shown in FIG. 4, where the vertical axis depicts the entrance height h, and the horizontal axis depicts the proportional constant k, which is expressed in the formula (3). The characteristics of the proportional constant k relative to the entrance height h (hereinafter referred as h-k characteristics) show the fidelity of the optical system to the ideal optical design, from which the fact that the proportional constant k is constant independent of the entrance height h means that the optical system is designed to be ideal, i.e. the tangent of the exit angle $\theta$ is exactly proportioned to the entrance height h.

In FIG. 5, it will be apparent that the optical system shown in FIG. 4 closely approximates the ideal characteristics, because the fluctuation of the proportional constant k of the optical system shown in FIG. 4 is within the range of 0.008.

Figure 6:
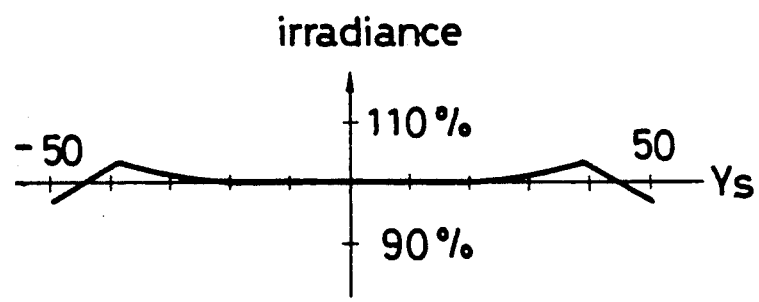
FIGS. 6 through 8 are, respectively, graphic representations of the irradiance distribution on the incident surface of the collimation lens.
Figure 7:
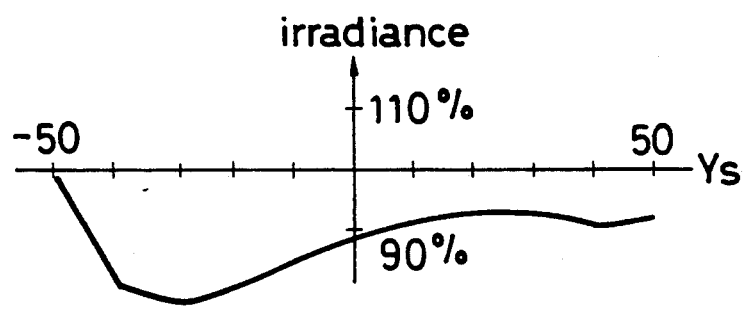
Figure 8:
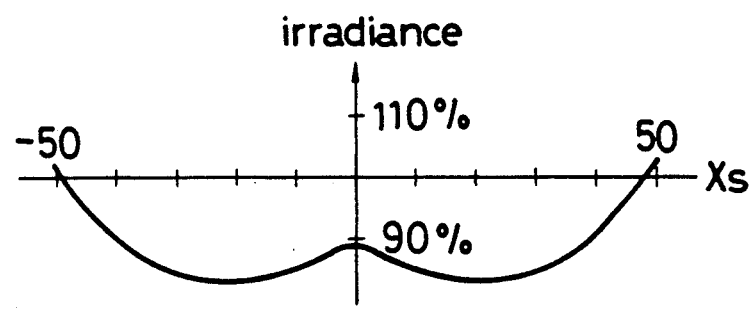

FIGS. 6 through 8 show an irradiance distribution on the incident surface of the collimation system CS when using the optical system shown in FIG. 4, in which the collimation system CS is disposed at a distance of 100 from the optical system. FIG. 6 is a graphic representation of the irradiance distribution in the case where the point source is positioned on the optical axis at a distance of 50 from the front surface of the optical system, and FIGS. 7 and 8 are graphic representations of the irradiance distribution of the meridional ray and the sagittal ray on the incident surface of the collimation system CS, respectively, in the case where the point source is positioned away by 14 from the optical axis and at a distance of 50 from the front surface of the optical system. The respective vertical axis of FIGS. 6 through 8 depicts the relative irradiance when the irradiance of the center of the collimation system CS is regarded as 100 percent.

From FIGS. 5 through 8, it will be apparent that the range of 100 in diameter on the incident surface of the collimation system can be illuminated evenly and uniformly by using the optical system shown in FIG. 4.

SECOND EXAMPLE

Figure 9:
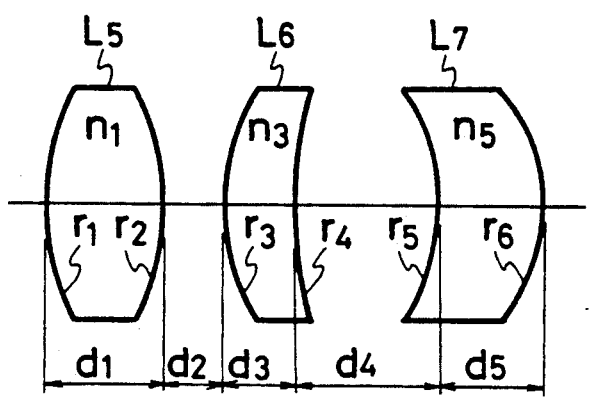
FIG. 9 is an elevational view of a second example of the optical system.

Referring to FIG. 9, a second example of the optical system OS comprises three optical units $L_5$ to $L_7$ including three lenses. The lens data of the optical system is listed in Table 2.

TABLE 2

|   | r      | d     | n     |
|---|--------|-------|-------|
| 1 | 2.608  | 0.326 | 1.671 |
| 2 | −1.680 | 0.200 |       |
| 3 | 0.848  | 0.326 | 1.671 |
| 4 | 3.260  | 0.341 |       |
| 5 | −1.956 | 0.461 | 1.684 |
| 6 | −0.820 |       |       | f = 1.0,
Effective Aperture = 1.0,
Maximum View Angle = 30 degrees

Figure 10:
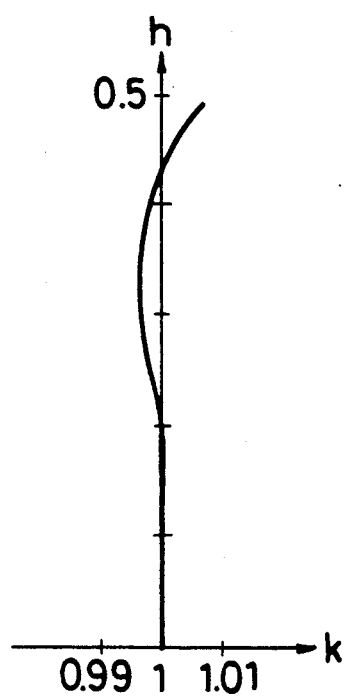
FIG. 10 is a graphic representation which shows the h-k characteristics of the second example.
Figure 11:
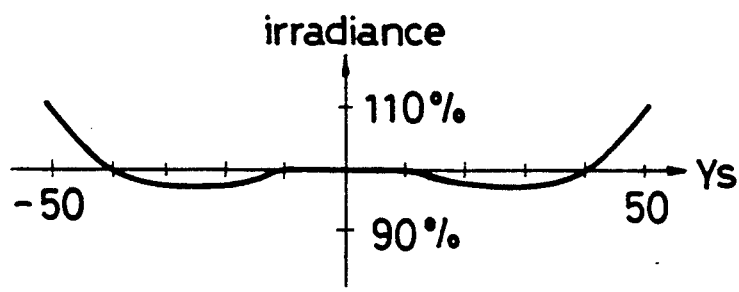
FIGS. 11 through 13 are, respectively, graphic representations of the irradiance distribution on the collimation lens, when using the second example.
Figure 12:
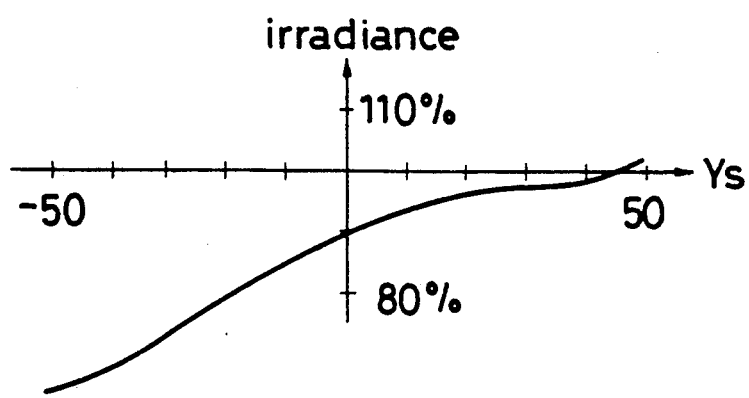
Figure 13:
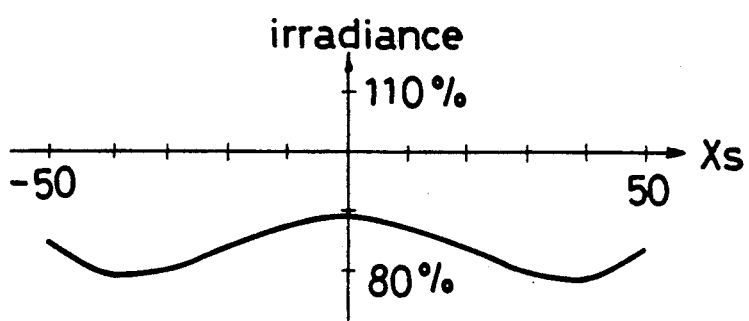

Referring to FIG. 10, there is shown the h-k characteristics of the optical system shown in FIG. 9. FIGS. 11 through 13, respectively, show an irradiance distribution on the incident surface of the collimation system CS when using the optical system shown in FIG. 9, in which the collimation system CS is placed at a distance of 100 from the rear surface of the optical system. FIG. 11 is a graphic representation of the irradiance distribution in the case where the point source is positioned on the optical axis at a distance of 50 from the front surface of the optical system. FIGS. 12 and 13 are graphic representations of the irradiance distribution of the meridional ray and the sagittal ray on the incident surface of the collimation system respectively, in the case where the point source is positioned away by 14 from the optical axis and at a distance of 50 from the front surface of the optical system. The respective vertical axis of FIGS. 11 through 13 depicts the relative irradiance when the irradiance of the center of the collimation system is regarded as 100 percent.

From FIGS. 10 through 13, it will be apparent that a range of 100 in diameter on the incident surface of the collimation system can be illuminated evenly and uniformly by using the optical system shown in FIG. 9.

THIRD EXAMPLE

Figure 14:
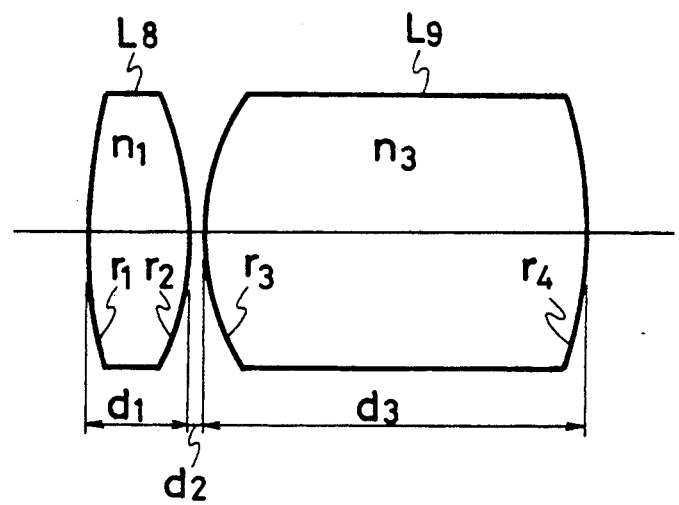
FIG. 14 is an elevational view of a third example of the optical system.

Referring to FIG. 14, a third example of the optical system OS comprises two optical units $L_8$ to $L_9$ including two lenses. The lens data of the optical system is listed in Table 3.

TABLE 3

|   | r      | d     | n     |
|---|--------|-------|-------|
| 1 | 2.240  | 0.430 | 1.470 |
| 2 | −0.972 | 0.075 |       |
| 3 | 0.747  | 1.494 | 1.470 |
| 4 | −0.747 |       |       | f = 1.0,
Effective Aperture = 1.0,
Maximum View Angle = 20 degrees

Figure 15:
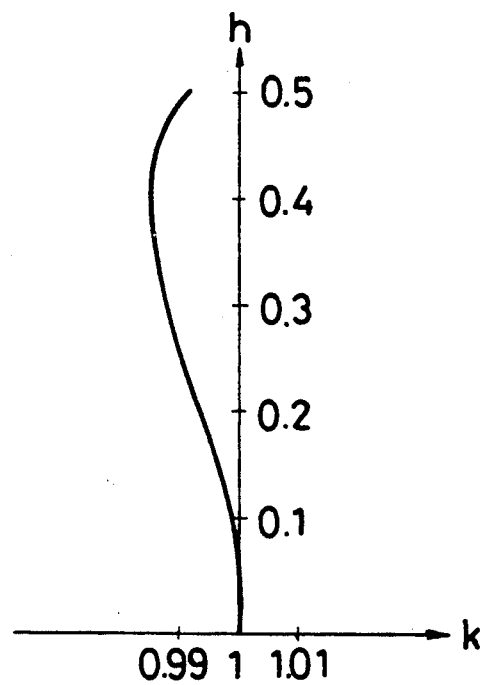
FIG. 15 is a graphic representation which shows the h-k characteristics of the third example.
Figure 16:
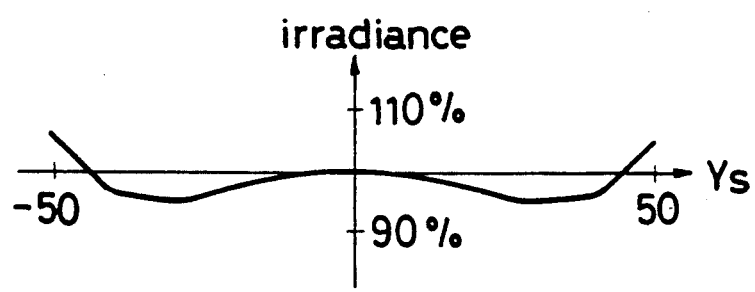
FIGS. 16 through 18 are, respectively, graphic representations of the irradiance distribution on the incident surface of the collimation lens, when using the third example.
Figure 17:
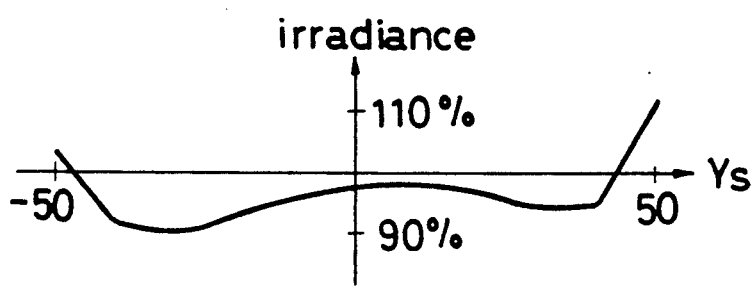
Figure 18:
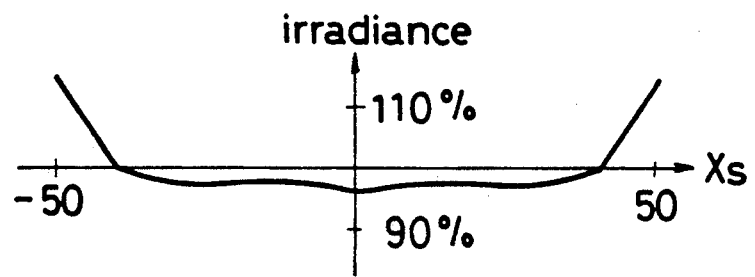

Referring to FIG. 15, there are shown the h-k characteristics of the optical system shown in FIG. 14. FIGS. 16 through 18, respectively, show an irradiance distribution on the incident surface of the collimation system CS when using the optical system shown in FIG. 14, in which the collimation system CS is placed at a distance of 100 from the rear surface of the optical system. FIG. 16 is a graphic representation of the irradiance distribution in the case where the point source is positioned on the optical axis at an infinite distance from the front surface of the optical system. FIGS. 17 and 18 are graphic representations of the irradiance distribution of the meridional ray and the sagittal ray on the incident surface of the collimation system CS respectively, in the case where the incident rays from the point source are entered into the optical system at the incident angle of 10 degrees. The respective vertical axis of FIGS. 16 through 18 depicts the relative irradiance when the irradiance of the center of the collimation system is regarded as 100 percent.

From FIGS. 15 through 18, it will be apparent that a range of 100 on diameter on the collimation system can be illuminated evenly and uniformly by using the optical system shown in FIG. 14.

FOURTH EXAMPLE

Figure 19:
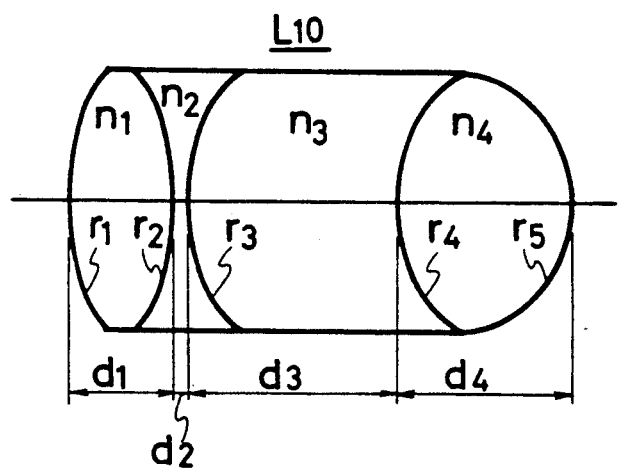
FIG. 19 is an elevational view of a fourth example of the optical system.

Referring to FIG. 19, a fourth example of the optical system comprises a single optical unit $L_{10}$ including four lenses. The lens data of the optical system is listed in Table 4.

TABLE 4

|   | r      | d     | n     |
|---|--------|-------|-------|
| 1 | 1.224  | 0.408 | 1.811 |
| 2 | −0.790 | 0.076 | 1.516 |
| 3 | 0.612  | 0.816 | 1.811 |
| 4 | 0.704  | 0.561 | 1.679 |
| 5 | −0.530 |       |       | f = 1.0,
Effective Aperture = 0.80,
Maximum View Angle = 30 degrees

Figure 20:
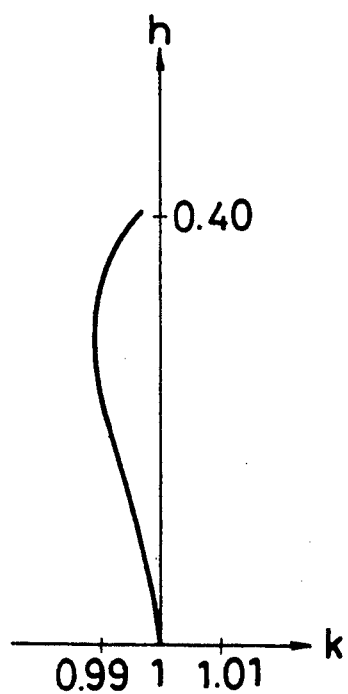
FIG. 20 is a graphic representation which shows the h-k characteristics of the fourth example.
Figure 21:
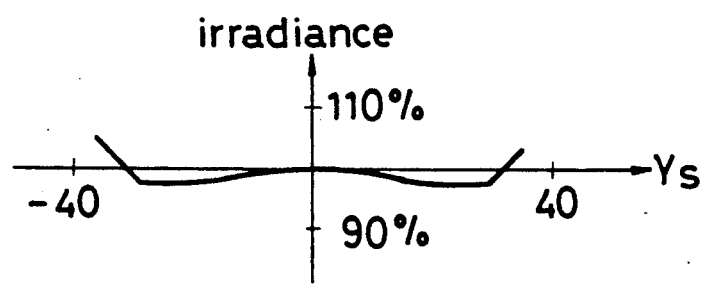
FIGS. 21 through 23 are, respectively, graphic representation of the irradiance distribution on the incident surface of the collimation lens.
Figure 22:
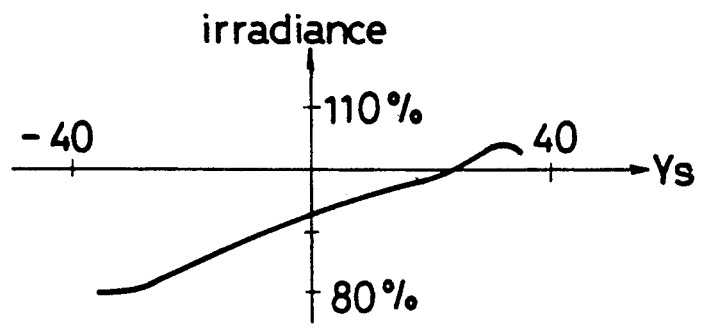
Figure 23:
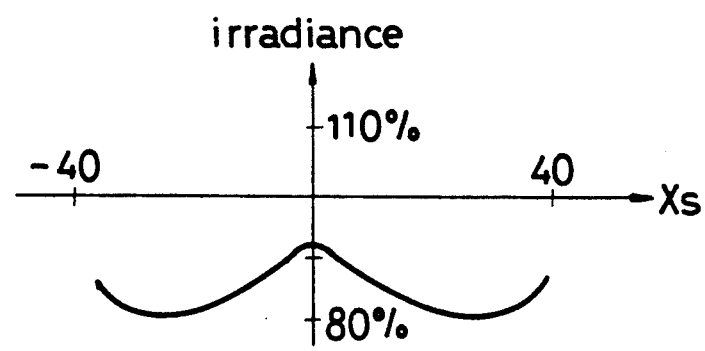

Referring to FIG. 20, there are shown the h-k characteristics of the optical system shown in FIG. 19. FIGS. 21 through 23, respectively, show an irradiance distribution on the incident surface of the collimation system CS when using the optical system shown in FIG. 15, in which the collimation system is placed at a distance of 100 from the rear surface of the optical system. FIG. 21 is a graphic representation of the irradiance distribution in the case where the point source is positioned on the optical axis at a distance of 50 from the front surface of the optical system, and FIGS. 22 and 23 are graphic representations of the irradiance distribution of the meridional ray and the sagittal ray on the incident surface of the collimation system CS respectively, in the case where the point source is positioned away by 14 from the optical axis and at a distance of 50 from the front surface of the optical system. The respective vertical axis of FIGS. 21 through 23 depicts the relative irradiance when the irradiance of the center of the collimation system is regarded as 100 percent.

From FIGS. 20 through 23, it will be apparent that a range of 70 in diameter on the incident surface of the collimation system can be illuminated evenly and uniformly by using the optical system shown in FIG. 19.

In the aforementioned four examples, only spherical lenses are used for the optical system OS, but an aspherical lens can also be used. The aspherical lens is designed as discussed below.

Returning back to FIG. 1, the tangent of the exit angle $\theta$ is expressed as follows:

$$\tan \theta = h/C \quad (6)$$

where h is an entrance height, and C is the distance between the entrance pupil A and the point P that the real image of the light source LS is formed.

Since the optical system is designed so that the entrance height h is proportioned to the tangent of the exit angle $\theta$, the following formula is obtained from the formulae (3) and (6):

$$C = k \quad (7)$$

In the case where the light source LS can be regarded as being positioned at the infinite distance, the distance C is equivalent to the focal length f. Thus, the following formula is established:

$$C = f \quad (8)$$

From the formulae (7) and (8), the following formula (9) is obtained:

$$k = f \quad (9)$$

Accordingly, the formula (3) can be transformed into the following formula:

$$\tan \theta = h/f \quad (10)$$

Figure 25:
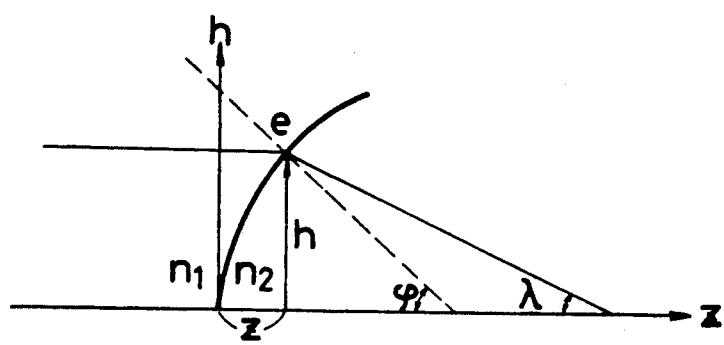
FIG. 25 is a schematic view of an optical system using an aspherical lens for explaining a refraction of the light entered thereinto.

Now, referring to FIG. 25, the symbol $n_1$ denotes the refractive index of a prior medium to the surface of an aspherical lens, the symbol $n_2$ denotes the refractive index of a posterior medium thereto, the symbol $\rho$ denotes the angle at the incident point e of the light from a source of infinite distance, between the normal of the surface and the optical axis, and the symbol $\lambda$ denotes the angle which the light refracted at the surface forms relative to the optical axis. Then, from Snell's law the following formula will be established:

$$n_1 \sin \rho = n_2 \sin(\rho - \lambda) \quad (11)$$

By expanding formula (11), the following formula can be obtained:

$$n_1 \sin\rho = n_2 \sin\rho\cos\lambda - n_2 \cos\rho\sin\lambda$$

-continued $$n_1 = n_2 \cos\lambda - n_2 \frac{\cos\rho}{\sin\rho} \sin\lambda$$

$$n_1 \tan\rho = n_2 \cos\lambda \tan\rho - n_2 \sin\lambda$$

$$\tan\rho = \frac{n_2 \sin\lambda}{n_2 \cos\lambda - n_1} \quad (12)$$

Now, a discussion is given with regard to the relational expression between the distance z and the distance h, which represents the configuration of the surface of the aspherical lens. The inclination of the surface at the point e is expressed by dh/dz, and the inclination of the normal at the point e relative to the surface is expressed by 1,/dh/dz i.e. dz/dh.

Whereas, as apparent from FIG. 25, the inclination of the normal really is expressed by tan $\rho$.

Accordingly, the formula is established from the above:

$$\frac{dz}{dh} = \tan\rho \quad (13)$$

Then, from the formulae (12) and (13) obtained is the following formula:

$$\frac{dz}{dh} = \frac{n_2 \sin\lambda}{n_2 \cos\lambda - n_1} \quad (14)$$

Whereas, $\sin^2\lambda + \cos^2\lambda = 1$ and $$\tan\lambda = \frac{\sin\lambda}{\cos\lambda},$$

then these are transformed into sin $$\lambda = \frac{\tan\lambda}{\sqrt{1 + \tan^2\lambda}}$$

and $\cos\lambda =$ $$\cos\lambda = \frac{1}{\sqrt{1 + \tan^2\lambda}},$$

hence these are further transformed, in consideration of the formula (10), into sin $$\lambda = \frac{h}{\sqrt{f^2 + h^2}}$$

and $\cos \lambda =$ $$\cos\lambda = \frac{f}{\sqrt{f^2 + h^2}}.$$

Then, by substituting these for the formula (14) obtained is the following formula:

$$\frac{dz}{dh} = \frac{n_2 \cdot \frac{h}{\sqrt{f^2 + h^2}}}{n_2 \cdot \frac{f}{\sqrt{f^2 + h^2}} - n_1} \quad (15)$$

$$= \frac{n_2 \cdot h}{n_2 f - n_1 \sqrt{f^2 + h^2}}$$

Assuming f=1, the differential equation is resolved as follows:

$$z = -\frac{n_2}{n_1} \sqrt{1 + h^2} - \left(\frac{n_2}{n_1}\right)^2 \log|n_1 - n_2 \sqrt{1 + h^2}| + C \quad (16)$$

where C is an integration constant.

In the case where the intersection of the refraction surface and the optical axis is regarded as an origin of the z-axis, the integration constant C is expressed as the following formula:

$$C = \frac{n_2}{n_1} + \left(\frac{n_2}{n_1}\right)^2 \log|n_1 - n_2| \quad (17)$$

FIFTH EXAMPLE

Figure 24:
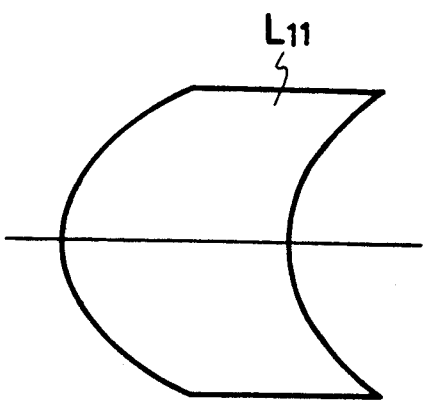
FIG. 24 is an elevational view of the fifth example of the optical system.

Referring to FIG. 24, a fifth example of the optical system OS comprises a single aspherical lens $L_{11}$.

In this example, the aspherical lens $L_{11}$ is made of a material having a refractive index of 1.5. Whereas, the prior medium to the lens $L_{11}$ is an air, hence the refractive index thereof is 1.0. By substituting values $n_1=1$ and $n_2=1.5$ for the formula (16) and (17), the following is obtained:

$$z = -1.5 \sqrt{1 + h^2} - 2.25 \log|1 - 1.5 \sqrt{1 + h^2}| - 0.06$$

Accordingly, the front configuration of the aspherical lens $L_{11}$ is expressed by this formula, and the shape of the rear surface thereof is designed so as to satisfy the condition that the exit light is not refracted at the rear surface.

SIXTH EXAMPLE

Figure 26:
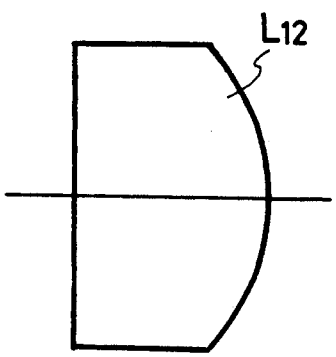
FIG. 26 is an elevational view of a sixth example of the optical system.

Referring to FIG. 26, a sixth example of the optical system comprises a single aspherical lens $L_{12}$. In this example, the front surface of the aspherical lens $L_{12}$ forms a plane, and the aspherical lens $L_{12}$ is made of a material having a refractive index of 1.5. The rear surface thereof is designed as follows.

Since the prior medium to the refraction in the rear surface is the aspherical lens having the refraction index of 1.5, and the posterior medium thereto is an air having an index of 1.0. Thus, by substituting the values $n_1=1.5$ and $n_2=1.0$ for the formulae (16) and (17), the following is obtained:

$$z = -\frac{1}{1.5} \sqrt{1 + h^2} -$$

$$\left(\frac{1}{1.5}\right)^2 \log|1.5 - \sqrt{1 + h^2}| + \frac{1}{1.5} + \left(\frac{1}{1.5}\right)^2 \log 0.05$$

SEVENTH EXAMPLE

Figure 27:
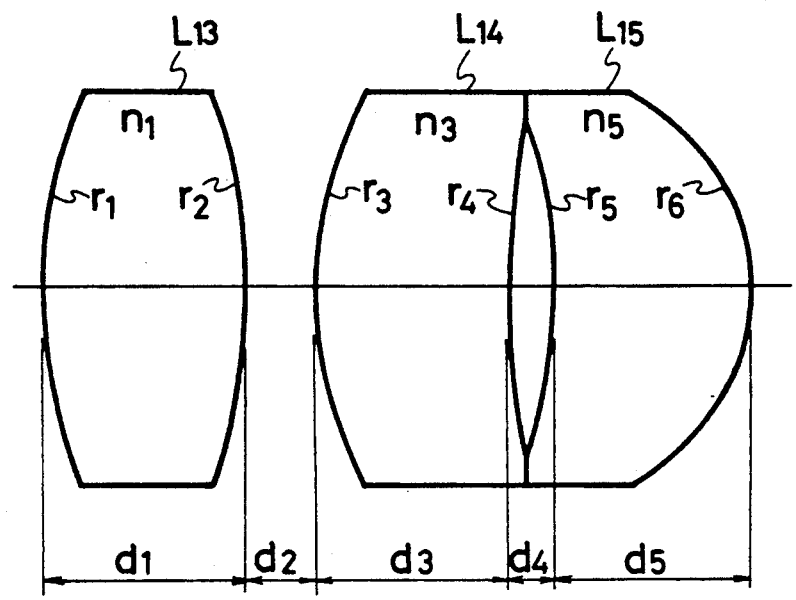
FIG. 27 is an elevational view of a seventh example of the optical system.

Referring to FIG. 27, a seventh example of the optical system comprises three optical units $L_{13}$ to $L_{15}$ including three lenses. Respective lens data of the optical system is listed in Table 5.

TABLE 5

|   | r       | d      | n       |
|---|---------|--------|---------|
| 1 | 1.2840  | 0.4879 | 1.67891 |
| 2 | −1.4895 | 0.1644 |         |
| 3 | 1.0272  | 0.4622 | 1.67891 |
| 4 | 2.6708  | 0.1079 |         |
| 5 | −1.2327 | 0.4622 | 1.67891 |
| 6 | −0.5239 |        |         | f = 1.0,
Effective aperture = 0.66 squire
Maximum View Angle = 26 degrees

EIGHTH EXAMPLE

Figure 29:
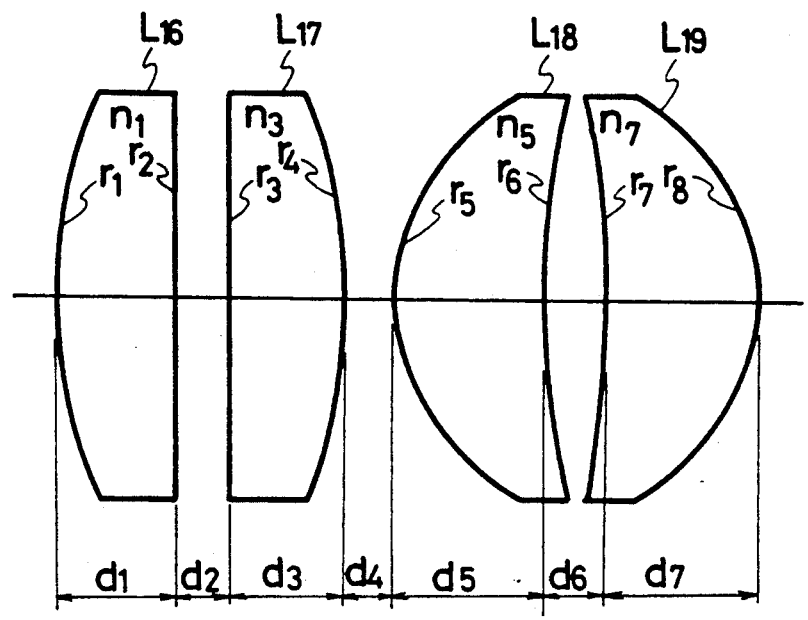
FIG. 29 is an elevational view of a eighth example of the optical system.

Referring to FIG. 29, an eighth example of the optical system comprises four optical units $L_{16}$ to $L_{19}$ including four lenses. Respective lens data of the optical system is listed in Table 6.

TABLE 6

|   | r       | d      | n       |
|---|---------|--------|---------|
| 1 | 1.6320  | 0.3560 | 1.67125 |
| 2 | ∞       | 0.1612 |         |
| 3 | ∞       | 0.3559 | 1.67125 |
| 4 | −1.6320 | 0.1343 |         |
| 5 | 0.6985  | 0.4567 | 1.67125 |
| 6 | 3.0289  | 0.1813 |         |
| 7 | −3.0289 | 0.4567 | 1.67125 |
| 8 | −0.6985 |        |         | f = 1.0,
Effective aperture = 0.66 squire
Maximum View Angle = 34 degrees

To avoid making the explanation lengthy, respective h-k characteristics and irradiance distribution of the above seventh and eighth examples are omitted here. However, it is noted that these are approximately the same as those in the first through sixth examples as mentioned above.

Among the lens data in the above two examples, since an object to be exposed is the photosensitive material PM having a rectangular form and for use in a printed circuit board, the effective area of illumination is also rectangular, and accordingly the entrance pupil of the optical system shown in the above seventh and eighth examples is designed to be rectangular, in order to match with a specific design of the illumination system shown in this embodiment. Furthermore, in this embodiment the illumination system is designed so that the entrance pupil of the optical system OS is conjugated with the incident surface of the collimation system CS.

In this embodiment, the aforementioned optical system OS is designed as a fly-eye lens structure, in which the fly-eye lens FE includes a plurality of the optical systems as mentioned above.

Figure 31:
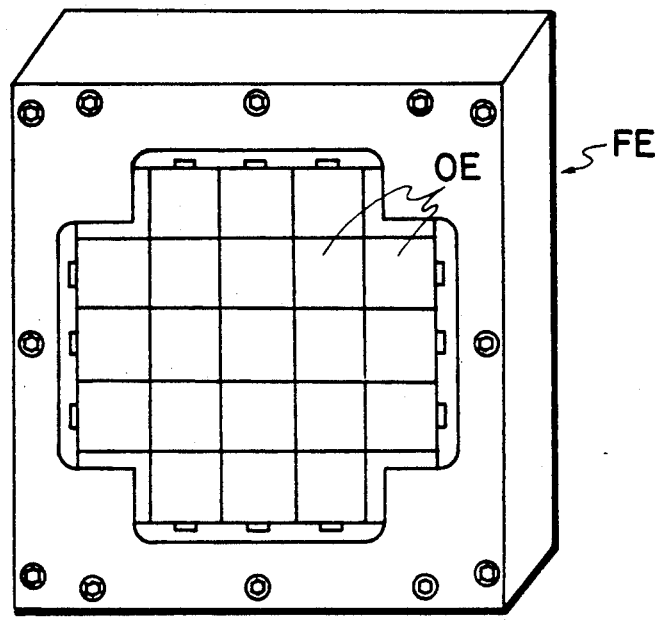
FIG. 31 is a perspective view of the fly-eye structure of the optical system.

Referring to FIG. 31, which shows a perspective view of the fly-eye lens structure. As can be understood from FIG. 31, the fly-eye lens FE comprises twenty-one optical elements OE, each of which in turn comprises the optical system OS satisfying the condition that the light received in the entrance pupil has an entrance height which is substantially proportioned to the tangent of the exit angle in the exit pupil as mentioned above.

The fly-eye lens FE is designed so that respective optical axes of optical systems thereof run in parallel to each other, whereby a plurality of rays exited therefrom are impinged on the incident surface of the collimation system CS. The fly-eye lens structure is very useful for resolving the irradiance non-uniformity at the entrance pupil, which enables the incident surface of the collimation system CS to be illuminated uniformly independent of the irradiance distribution at the entrance pupil. In addition to this feature, respective optical systems of the fly-eye lens provide uniform irradiation through the entire area of the incident surface of the collimation system, thus the irradiance distribution on the incident surface of the collimation system will become very uniform.

In this embodiment, the illumination system is designed so that the entrance pupil of the optical system OS is conjugated with the incident surface of the collimation system CS, accordingly light passing through a predetermined common point in the entrance pupil will impinge on a predetermined common point on the incident surface of the collimation system, and consequently light emitted from the light source and received in the entrance pupil will illuminate the predetermined area of the incident surface of the collimation system, without any loss of light quantity.

The above eight examples are indeed to be applicable to the illumination system according tot he present invention. However, these examples are shown in a general form, respectively, and thus it is necessary to determine every element of the optical system shown in the first through sixth examples so as to be in compliance with a specific design of the illumination system, which will be apparent for a person ordinarily skilled in the art to which the present pertains.

For example, the view angle relative to the optical system OS is designed as follows:

That is, the diameter D at the exit pupil of the ellipsoidal mirror EM is expressed by the formula:

$$D = 2a \cdot \tan_2^{10} 7$$

Where a is a distance between the exit pupil and the front surface of the optical system OS, $\omega$ is a view angle relative to the optical system. Accordingly, since the distance a is 800 mm in this embodiment, the diameter at the exit pupil of the ellipsoidal mirror EM can be easily determined.

Returning to FIG. 2, the illumination system according to the invention further comprises a reflection mirror $M_2$ disposed between the optical system OS and the collimation system CS. The reflection mirror $M_2$ is used to make the system small in size.

The collimation system CS comprises a rectangular Fresnel lens having the focal length of 1670 mm and the diagonal length of 1000×1000 mm. The diagonal length thereof is determined depending on that of the mask film MF.

In this embodiment he mask film MF bearing desired circuit patterns thereon has a diagonal length of 1000×1000 mm, and accordingly a Fresnel lens having the same diagonal length is used.

In this embodiment, the optical system OS is positioned so that a distance between the exit pupil of the ellipsoidal mirror EM and the entrance surface of the optical system OS is 800 mm, accordingly the secondary light source (i.e. image at the exit pupil of the ellipsoidal mirror EM) is formed at a point within the optical system at a distance by 1 mm when using the seventh example of the optical system, and by 3 mm when using the eighth example thereof, from the exit surface thereof, and consequently the Fresnel lens CS is positioned at a distance 1670 mm, which corresponds to the focal length thereof, from the position of the secondary light source P.

Figure 32:
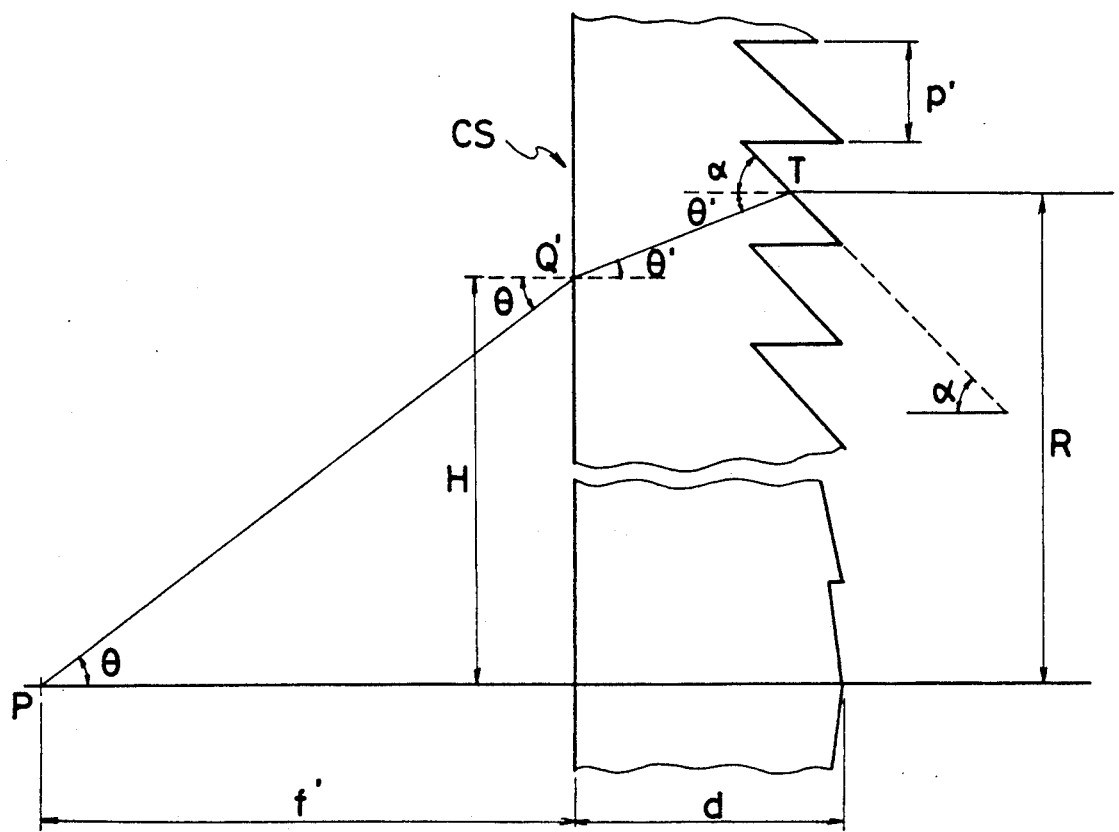
FIG. 32 is a sectional view showing the configuration of a Fresnel lens to be incorporated into the illumination system.

The configuration of the Fresnel lens is designed as follows:

Referring to FIG. 32, provided that the secondary light source P is positioned on the optical axis at a distance f' from the incident surface of the Fresnel lens CS, light emitted therefrom is impinged upon a point Q which is distant from the optical axis by a distance H. The incident angle $\theta$ at the point Q is expressed by the following formula:

$$\theta = \tan^{-1}(H/f') \tag{18}$$

From the Snell's law the following formula is obtained:

$$\sin\theta = n \sin\theta'$$

where n is a refractive index of the medium of which the Fresnel lens is made. From this formula, the angle $\theta'$ which light entered into the Fresnel lens forms relative to the optical axis is obtained as follows:

$$\theta' = \sin^{-1}\left(\frac{\sin\theta}{n}\right) \tag{19}$$

In order to establish the condition that the light transmitted through a point T, which is on the exit surface of the Fresnel lens and at the distance R from the optical axis, runs parallel to the optical axis, it is necessary that the following formula is established:

$$n \sin(90° - \theta' - \alpha) = \sin(90° - \alpha) \tag{20}$$

where $\alpha$ is the angle that the groove surface bearing the point T thereon forms relative to the optical axis.

Resolving this formula in respect of $\alpha$, the following formula is obtained:

$$\tan\alpha = \frac{n\cos\theta' - 1}{n\sin\theta'} \tag{20}$$

The distance R is expressed by the following formula:

$$R = H + d \tan\theta' \tag{21}$$

where d is the thickness of the Fresnel lens.

Accordingly, a Fresnel lens which satisfies the condition that light passing through the point T of the exit surface of the Fresnel lens runs parallel to the optical axis can be obtained by using the formulae (18) through (21).

Several examples of the Fresnel lens, which can be applied to the illumination system according to the invention, are shown hereafter.

FIRST EXAMPLE

A first example of a Fresnel lens which can be incorporated into the first through third examples of the optical system OS meets the lens data listed in Table 7.

TABLE 7

| R (m/m) | $\alpha$ (deg) | H (m/m) | $\Theta$ (deg) | $\Theta'$ (deg) |
|---|---|---|---|---|
| 100.000 | 81.799 | 99.764 | 4.036 | 2.707 |
| 200.000 | 73.879 | 199.529 | 8.032 | 5.381 |
| 300.000 | 66.469 | 299.298 | 11.951 | 7.989 |
| 400.000 | 59.711 | 399.073 | 15.761 | 10.503 |
| 500.000 | 53.668 | 498.855 | 19.433 | 12.902 |
| 600.000 | 48.333 | 598.644 | 22.946 | 15.168 |
| 700.000 | 43.663 | 698.444 | 26.287 | 17.291 |
| 707.000 | 43.359 | 705.430 | 26.514 | 17.434 | where the distance f' between the secondary light source P and the incident surface of the Fresnel lens is 1414 mm; the focal length is also 1414 mm; lens thickness d is 5 mm; the refractive index is 1.49; groove pitch p' is 0.2 mm; and the effective aperture is 1000 mm in diagonal.

SECOND EXAMPLE

A second example of a Fresnel lens which can be incorporated into the fourth example of the optical system OS exhibits the lens data listed in Table 8.

TABLE 8

| R (m/m) | $\alpha$ (deg) | H (m/m) | $\Theta$ (deg) | $\Theta'$ (deg) |
|---|---|---|---|---|
| 100.000 | 84.574 | 99.740 | 2.827 | 1.859 |
| 200.000 | 79.234 | 199.482 | 5.640 | 3.707 |
| 300.000 | 74.056 | 299.225 | 8.426 | 5.532 |
| 400.000 | 69.106 | 398.972 | 11.173 | 7.324 |
| 500.000 | 64.431 | 498.722 | 13.869 | 9.073 |
| 600.000 | 60.060 | 598.478 | 16.503 | 10.771 |
| 700.000 | 56.007 | 698.239 | 19.068 | 12.412 |
| 707.000 | 55.735 | 705.223 | 19.245 | 12.524 | where the distance f' between the secondary light source P and the incident surface of the Fresnel lens is 2020 mm; the focal length is also 2020 mm; lens thickness d is 8 mm; the refractive index is 1.52; groove pitch p' is 0.5 mm; and the effective aperture is 1000 mm in diagonal.

THIRD EXAMPLE

A third example of a Fresnel lens which can be incorporated into the seventh and eighth examples of the optical system OS exhibits the lens data listed in Table 9.

TABLE 9

| R (m/m) | $\alpha$ (deg) | H (m/m) | $\Theta$ (deg) | $\Theta'$ (deg) |
|---|---|---|---|---|
| 100.000 | 83.042 | 99.800 | 3.420 | 2.295 |
| 200.000 | 76.257 | 199.600 | 6.816 | 4.568 |
| 300.000 | 69.795 | 299.404 | 10.164 | 6.802 |
| 400.000 | 63.764 | 399.210 | 13.444 | 8.977 |
| 500.000 | 58.226 | 499.021 | 16.637 | 11.078 |
| 600.000 | 53.204 | 598.837 | 19.727 | 13.093 |
| 700.000 | 48.689 | 698.659 | 22.702 | 15.012 |
| 707.000 | 48.392 | 705.647 | 22.906 | 15.143 | where the distance f' between the secondary light source P and the incident surface of the Fresnel lens is 1670 mm; the focal length is also 1670 mm; lens thickness d is 5 mm; the refractive index is 1.49; groove pitch p' is 0.05 mm; and the effective aperture is 1000 mm in diagonal.

Figure 28:
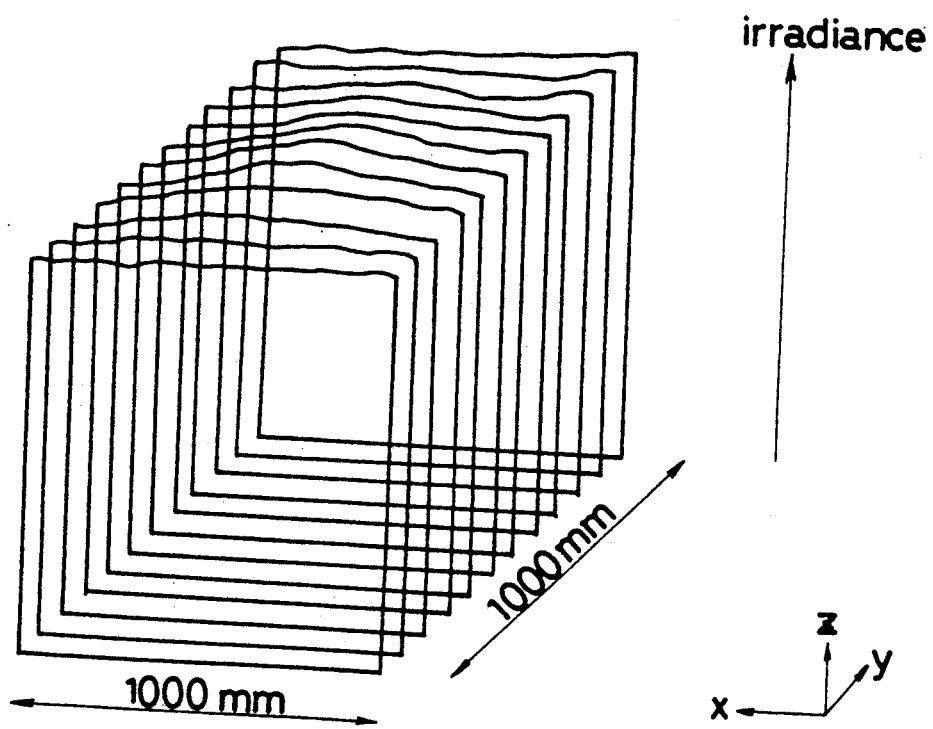
FIG. 28 is a schematic graphic representation of the irradiance distribution on the incident surface of the Fresnel lens, hence of a mask film MF.
Figure 30:
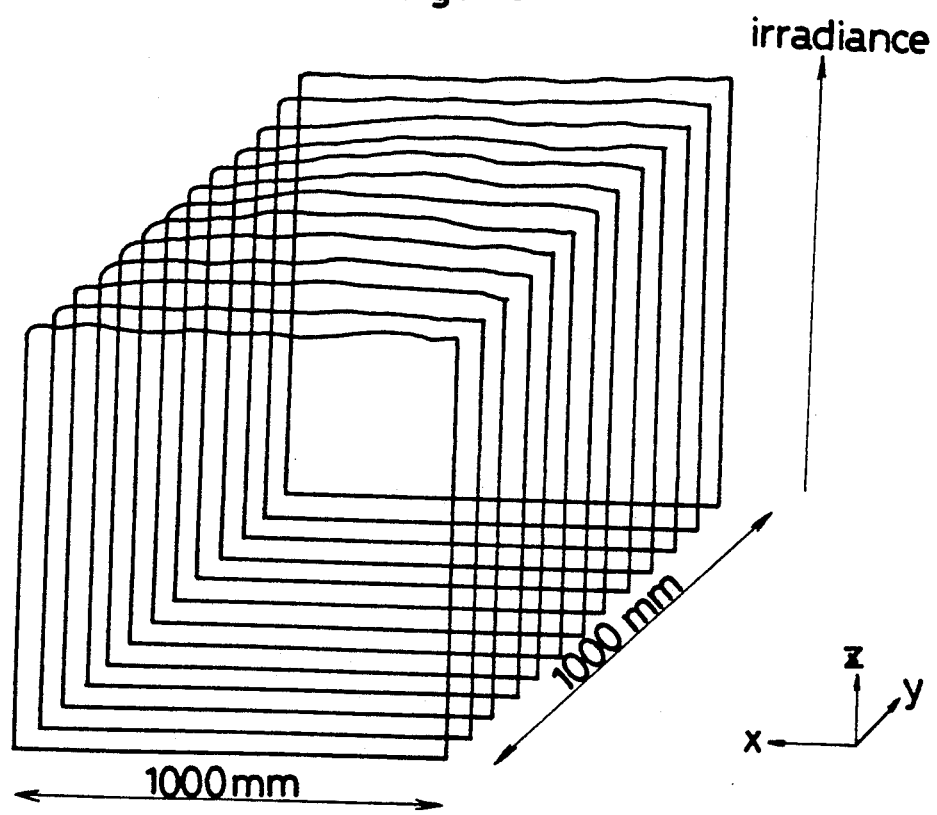
FIG. 30 is a schematic graphic representation of the irradiance distribution on the incident surface of the Fresnel lens, hence of a mask film MF.

Referring to FIGS. 28 and 30, there are respectively shown the irradiance distribution on the mask film MF when using the optical systems shown in FIGS. 27 and 29, respectively. The x-axis and y-axis thereof respectively show the coordinate positions on the mask film MF, and the z-axis thereof shows the irradiance at the position corresponding to the coordinate position thereof. It will be apparent from FIGS. 28 and 30 that the irradiance distribution on the mask film MF falls within the dispersion range of ±5 percent, in spite of such a wide area as 1000×1000 mm, which attests that the illumination system according to the invention is most suitable for applying the well-collimated light without any irradiance reduction in the peripheral area of the mask film MF. Whereas, in the conventional illumination system the irradiance distribution on an object falls within the dispersion range of as much as ±30 percent, from which the difference between the conventional illumination systems and the present invention can be clearly understood.

A photosensitive material PM is positioned immediately under the mask film MF, e.g. at a distance of 0.3 mm therebetween. Exposure of a desired circuit pattern is made accurately and effectively on the photosensitive material.

While the invention has been illustrated and described as embodied an illumination system, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by letters patent is set forth in the appended claims.

1. An illumination system, comprising:
  a light source for producing light;
  a reflector positioned with respect to said light to produce therefrom directed light;
  an optical means having an entrance pupil for receiving said directed light at a characteristic entrance height, an exit pupil for passing the directed light received by said entrance pupil, and an optical axis leading from said exit pupil to an object to be illuminated, said optical means being effective for causing said light passing through said exit pupil to pass therefrom at an exit angle having a tangent which is substantially proportional to the entrance height of said directed light at said entrance pupil, including when said exit angle is larger than 10 degrees; and
  collimation means, having a focal point which is in compliance with a focal point associated with said optical means, disposed between said exit pupil and said object to be illuminated for collimating light arriving at said object, said object to be illuminated being positioned on said optical axis whereby a uniform illumination is obtained on said object with a relatively short optical path of said illumination system.

2. An illumination system according to claim 1 wherein said collimation means comprises a Fresnel lens.

3. An illumination system according to claim 2, wherein said Fresnel lens comprises a flat incident surface and a grooved exit surface with respect to the optical means.

4. An illumination system according to claim 2, wherein said Fresnel lens is constructed to satisfy the formulae:

$$\theta = \tan^{-1}\left(\frac{H}{f'}\right)$$

$$\theta' = \sin^{-1}\left(\frac{\sin\theta}{n}\right)$$

$$\tan\alpha = \frac{n\cos\theta' - 1}{n\sin\theta'}$$

$$R = H + d\tan\theta'$$

said Fresnel lens lying on said optical axis and having associated therewith an incident surface, a first locus of points bounding light received at said lens, a second locus of points bounding light passing out of said Fresnel lens, and a grooved surface;
  where f' is the distance, along the optical axis, form the focal point of the optical means to the incident surface of the Fresnel lens; H is a distance from the optical axis to the first locus of point; $\theta$ is the incident angle at said first locus of points; n is the refractive index of a medium associated with said Fresnel lens; $\theta'$ is the angle formed by the light entering said Fresnel lens relative to said optical axis; a is the angle formed by the grooved surface relative to the optical axis; R is the distance from the optical axis to the second locus of points; and d is the thickness of said Fresnel lens.

* * * * *